(12) United States Patent
Lee

(10) Patent No.: US 9,997,215 B2
(45) Date of Patent: Jun. 12, 2018

(54) SEMICONDUCTOR MEMORY DEVICE AND OPERATING METHOD THEREOF

(71) Applicant: SK hynix Inc., Icheon-si, Gyeonggi-do (KR)

(72) Inventor: Jung Hwan Lee, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/244,134

(22) Filed: Aug. 23, 2016

(65) Prior Publication Data

US 2017/0263293 A1   Sep. 14, 2017

(30) Foreign Application Priority Data

Mar. 8, 2016   (KR) ........................ 10-2016-0027771

(51) Int. Cl.
  *G11C 7/12*   (2006.01)
  *G11C 7/06*   (2006.01)
  *G11C 7/10*   (2006.01)

(52) U.S. Cl.
  CPC ................ *G11C 7/12* (2013.01); *G11C 7/067* (2013.01); *G11C 7/106* (2013.01); *G11C 2207/063* (2013.01)

(58) Field of Classification Search
  None
  See application file for complete search history.

(56) References Cited

U.S. PATENT DOCUMENTS

| 2011/0134704 A1* | 6/2011 | Lee | ............... G11C 16/0483 365/185.22 |
| 2011/0305087 A1* | 12/2011 | Lee | ............... G11C 16/0483 365/185.12 |

FOREIGN PATENT DOCUMENTS

| KR | 1020120005942 A | 1/2012 |
| KR | 1020140064434 A | 5/2014 |

* cited by examiner

*Primary Examiner* — James G Norman
(74) *Attorney, Agent, or Firm* — William Park & Associates Ltd.

(57) ABSTRACT

In an embodiment, a semiconductor memory device may include a memory cell array, a plurality of page buffers, and a control logic. The memory cell array may include a plurality of memory cells. The plurality of page buffers may be coupled to a plurality of bit lines of the memory cell array, respectively. The control logic may control the plurality of page buffers to perform a read operation on the memory cell array. Each of the plurality of page buffers may perform data sensing by changing a voltage of a page buffer sensing signal after an internal node is precharged.

19 Claims, 7 Drawing Sheets

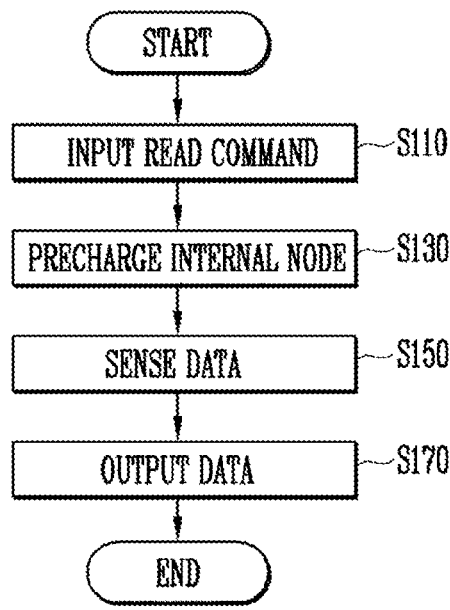
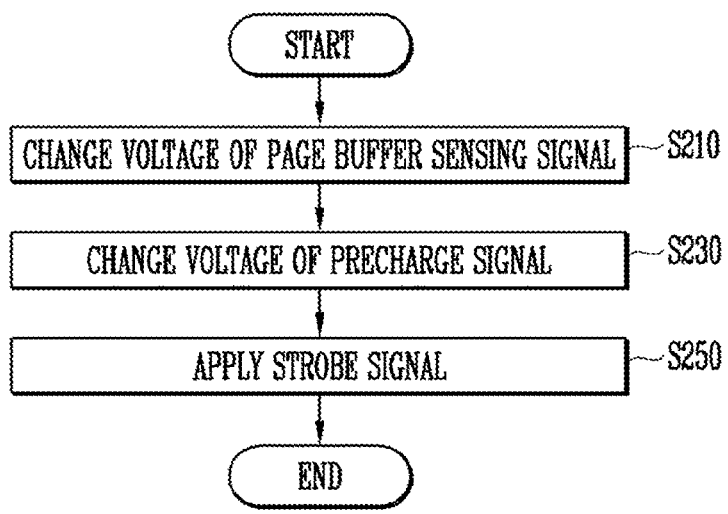

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2016-0027771 filed on Mar. 8, 2016 in the Korean Intellectual Property Office, the entire disclosure of which is incorporated herein by reference.

BACKGROUND

1. Technical Field

An aspect of the present disclosure generally relates to an electronic device, and more particularly to a semiconductor memory device and an operating method thereof.

2. Related Art

A semiconductor memory device may be manufactured as an integrated circuit. Semiconductor memory devices are data storage devices implemented on the integrated circuit. The semiconductor memory device may be classified into a volatile memory device and a nonvolatile memory device.

The volatile memory is a memory device that only retains its data while it is powered. Examples of the volatile memory include a static random access memory (SRAM), a dynamic RAM (DRAM), a synchronous DRAM (SDRAM), and the like. The nonvolatile memory may retain its data even in the absence of a power source. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

According to an aspect of the present disclosure, a semiconductor memory device may include a memory cell array, a plurality of page buffers, and a control logic. The memory cell array may include a plurality of memory cells. The plurality of page buffers may be coupled to a plurality of bit lines of the memory cell array, respectively. The control logic may control the plurality of page buffers to perform a read operation on the memory cell array. Each of the plurality of page buffers may perform data sensing by changing a voltage of a page buffer sensing signal after an internal node is precharged.

The control logic may receive a first page buffer sensing voltage and a second page buffer sensing voltage. The control logic may generate the page buffer sensing signal, based on the first page buffer sensing voltage and the second page buffer sensing voltage. The control logic may apply the generated page buffer sensing signal to the plurality of page buffers.

The page buffer sensing signal may maintain the first page buffer sensing voltage during a period of time during which the internal node is precharged.

The first page buffer sensing voltage may be greater than the second page buffer sensing voltage.

The page buffer sensing signal may be changed to the second page buffer sensing voltage when a data sensing time is started or when a predetermined period of time has passed after the data sensing time started.

Each of the plurality of page buffers may include a bit line sensing circuit, a clamp circuit, a latch circuit, a current determining circuit, and a potential level adjuster. The bit line sensing circuit may be coupled to one of the plurality of bit lines and the internal node to control a potential of the internal node according to a potential of the one of the plurality of bit lines. The clamp circuit may be coupled between a power supply and the internal node to precharge the internal node. The latch circuit may latch data in a sensing operation. The current determining circuit may allow current corresponding to a potential of a sensing node in the clamp circuit to flow to the latch circuit. The potential level adjuster may be coupled to the sensing node to adjust a precharge potential level of the sensing node.

The plurality of memory cells included in the memory cell array may be memory cells having a vertical channel structure.

According to an aspect of the present disclosure, a semiconductor memory device may include a memory cell array and a plurality of page buffers. The memory cell array may include a plurality of memory cells. The plurality of page buffers may be coupled to a plurality of bit lines of the memory cell array, respectively. Each of the plurality of page buffers may perform data sensing by changing a voltage of a page buffer sensing signal after an internal node is precharged.

The semiconductor memory device may further include a control logic configured to control the plurality of page buffers to perform a read operation on the memory cell array.

The control logic may apply the page buffer sensing signal to at least one of the plurality of page buffers.

The control logic may receive a first page buffer sensing voltage and a second page buffer sensing voltage. The control logic may generate the page buffer sensing signal, based on the first page buffer sensing voltage and the second page buffer sensing voltage. The control logic may apply the generated page buffer sensing signal to the plurality of page buffers.

The first page buffer sensing voltage may be greater than the second page buffer sensing voltage.

When a precharge signal input to the page buffer is changed from a turn-on state to a turn-off state, the voltage of the page buffer sensing signal may be changed from the first page buffer sensing voltage to the second page buffer sensing voltage.

Before the precharge signal input to the page buffer is transitioned from the turn-on state to the turn-off state, the voltage of the page buffer sensing signal may be changed from the first page buffer sensing voltage to the second page buffer sensing voltage.

According to an aspect of the present disclosure, there is provided a method of operating a semiconductor memory device. The method may include receiving a read command. The method may include precharging an internal node of a page buffer in response to the read command. The method may include changing a voltage of a page buffer sensing signal. The method may include sensing a voltage received through a bit line of a memory cell array.

Changing the voltage of the page buffer sensing signal may include changing the voltage of the page buffer sensing signal from a first page buffer sensing voltage to a second page buffer sensing voltage.

The first page buffer sensing voltage may be greater than the second page buffer sensing voltage.

When a precharge signal input to the page buffer is transitioned from a turn-on state to a turn-off state, the page buffer sensing signal may be changed.

Before the precharge signal input to the page buffer is transitioned from the turn-on state to the turn-off state, the page buffer sensing signal may be changed.

The second page buffer sensing voltage may be smaller than the first page buffer sensing voltage.

BRIEF DESCRIPTION OF THE DRAWINGS

FIG. 8 is a flowchart illustrating an example of an operating method of the semiconductor memory device according to an embodiment of the present disclosure.

FIG. 9 is a timing diagram illustrating in detail an example of a step of sensing data in FIG. 8.

DETAILED DESCRIPTION

Figure 1:
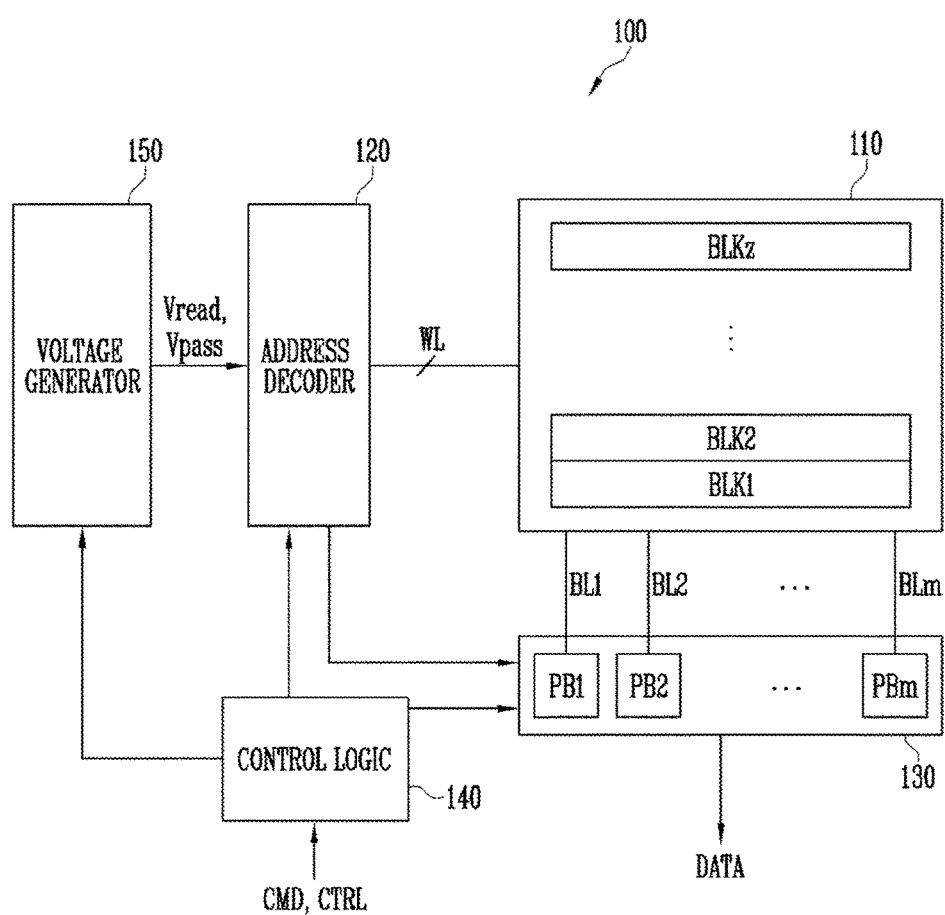
FIG. 1 is a diagram illustrating an example of a semiconductor memory device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 is a diagram illustrating an example of a semiconductor memory device according to an embodiment of the present disclosure.

Referring to FIG. 1, the semiconductor memory device 100 includes a memory cell array 110, an address decoder 120, a read/write circuit 130, a control logic 140, and a voltage generator 150.

Memory cells of the semiconductor memory device 100 may be arranged in the memory cell array 100. The memory cells of the memory cell array 110 may be grouped into a plurality of memory blocks BLK1 to BLKz. The plurality of memory blocks BLK1 to BLKz may be coupled to the address decoder 120 through word lines WL, and may be coupled to the read/write circuit 130 through bit lines BL1 to BLm. In an embodiment, the plurality of memory cells may be nonvolatile memory cells, and may be nonvolatile memory cells having a vertical channel structure.

The address decoder 120, the read/write circuit 130, and the control logic 140 operate as peripheral circuits for driving the memory cell array 110.

The address decoder 120 may be coupled to the memory cell array 110 through the word lines WL. The address decoder 120 may operate in response to control signals of the control logic 140. The address decoder 120 may select one or more word lines WL in response to an address provided through an input/output buffer (not illustrated) of the semiconductor memory device 100.

The address may include a block address that is used to select one or more of the memory blocks BLK1 to BLKz of the memory cell array 110. The address decoder 120 may decode the address to obtain a block address. The address decoder 120 may select at least one memory block according to the decoded block address. In applying a read voltage during a read operation, the address decoder 120 may apply a read voltage Vread generated by the voltage generator 150 to a selected word line of the selected memory block, and may apply a pass voltage Vpass to the other unselected word lines of the selected memory block. In a program verification operation which is performed during a program operation to check whether the program operation has been completed properly, the address decoder 120 may apply a verification voltage generated by the voltage generator 150 to a selected word line of the selected memory block, and may apply the pass voltage Vpass to the other word lines (unselected word lines) of the selected memory block.

The address may include a column address that is used to select columns of the memory cell array 110. The address decoder 120 may decode the address to obtain a column address. The address decoder 120 may transmit the decoded column address to the read/write circuit 130.

The read and program operations of the semiconductor memory device 100 may be performed on a page basis. The address received together with the request of the read and program operations may include a block address, a row address, and a column address. The address decoder 120 may select one memory block and one word line according to the block address and the row address. The column address obtained by decoding the address decoder 120 may be provided to the read/write circuit 130.

The address decoder 120 may include a block decoder, a row decoder, a column decoder, an address buffer, and the like.

The read/write circuit 130 may include a plurality of page buffers PB1 to PBm. The plurality of page buffers PB1 to PBm may be coupled to the memory cell array 110 through the bit lines BL1 to BLm. For example, the plurality of page buffers PB1 to PBm may include latches for storing data transferred to/from the memory cell array 110 and sense amplifiers for sensing bit-line potentials of the bit lines BL1 to BLm during a read operation or during a program verification operation. The plurality of page buffers PB1 to PBm may sense, through sensing nodes, bit-line potentials of the bit lines BL1 to BLm (or the amount of current flowing through the bit lines BL1 to BLm) that vary depending on program states (threshold voltages) of corresponding memory cells while continuously supplying a sensing current to bit lines coupled to the memory cells. In this way, the plurality of page buffers PB1 to PBm may sense threshold voltages of the memory cells in the read operation and the program verification operation and temporarily store the sensed threshold voltages of the memory cells as data.

The read/write circuit 130 may operate in response to buffer control signals output from the control logic 140.

The read/write circuit 130 may temporarily store data obtained by sensing program states (threshold voltages) of the memory cells in the read operation, and then may output data DATA to the input/output buffer (not illustrated) of the semiconductor memory device 100.

In an example embodiment, the read/write circuit 130 may include page buffers (or page registers), a column select circuit, and the like.

The control logic 140 may be coupled to the address decoder 120, the read/write circuit 130, and the voltage generator 150. The control logic 140 may receive a command CMD and a control signal CTRL through the input/output buffer (not illustrated) of the semiconductor memory device 100. The control logic 140 may control the general operations of the semiconductor memory device 100 in response to the control signal CTRL. The control logic 140 may output a control signal for adjusting precharge potential levels of the sensing nodes of the plurality of page buffers PB1 to PBm.

The voltage generator 150 may generate the read voltage Vread and the pass voltage Vpass in the read operation in response to a voltage generator control signal output from the control logic 140.

Figure 2:
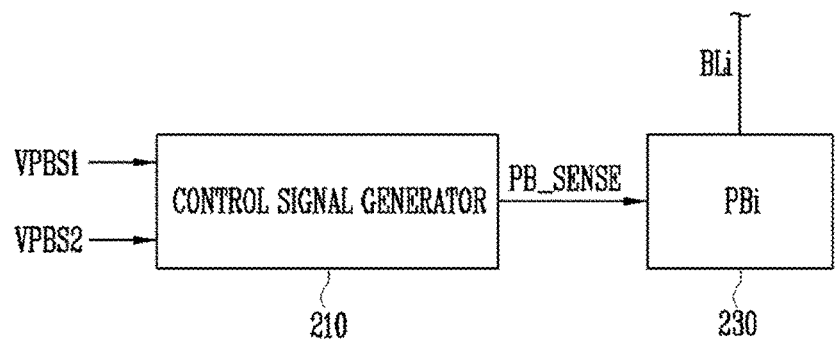
FIG. 2 is a diagram illustrating an example configuration of a control logic and a page buffer according to an embodiment of the present disclosure.

FIG. 2 is a diagram illustrating an example of a control logic and a page buffer according to an embodiment of the present disclosure.

FIG. 2 illustrates a control signal generator 210 and a page buffer 230. Although not illustrated in FIG. 2, the control signal generator 210 may be a part of the control logic 140 illustrated in FIG. 1. In addition, the page buffer 230 may refer to an $i^{th}$ page buffer PBi among the plurality of page buffers PB1 to PBm included in the read/write circuit 130 of FIG. 1. Therefore, the $i^{th}$ page buffer 230 may be coupled to an $i^{th}$ bit line BLi among the bit lines BL1 to BLm shown in FIG. 1.

The control signal generator 210 may receive a first page buffer sensing voltage VPBS1 and a second page buffer sensing voltage VPBS2. Although not illustrated in FIG. 2, the first page buffer sensing voltage VPBS1 and the second page buffer sensing voltage VPBS2 may be voltages generated by the voltage generator 150 of FIG. 1. The control signal generator 210 may generate a page buffer sensing signal PB_SENSE based on the received first and second page buffer sensing voltages VPBS1 and VPBS2. The generated page buffer sensing signal PB_SENSE may be transmitted to the $i^{th}$ page buffer PBi. Although not illustrated in FIG. 2, the page buffer sensing signal PB_SENSE may be transmitted not only to the $i^{th}$ page buffer PBi, but also to other page buffers. When a plurality of page butter sensing signals PB_SENSE is transmitted to a plurality of page buffers, they may be transmitted simultaneously.

In an embodiment of the present disclosure, the control signal generator 210 may change a voltage level of the page buffer sensing signal PB_SENSE after an internal node is precharged. In an embodiment, after the internal node is precharged, the control signal generator 210 may change the voltage level of the page buffer sensing signal PB_SENSE from the first page buffer sensing voltage VPBS1 to the second page buffer sensing voltage VPBS2 and apply the changed page buffer sensing signal PB_SENSE (i.e., the second page buffer sensing voltage VPBS2) to the $i^{th}$ page buffer 230. The ith page buffer 230 may perform data sensing, based on the changed page buffer sensing signal PB_SENSE. For example, when the $i^{th}$ page buffer 230 performs data sensing during a read operation or during a program verification operation, the changed page buffer sensing signal PB_SENSE (i.e., the second page buffer sensing voltage VPBS2) may be applied to a transistor that is used to sense the bit-line potential of the bit line BLi.

A change in the voltage of the page buffer sensing signal PB_SENSE applied to the $i^{th}$ page buffer 230 will be described later with reference to FIGS. 4 to 7.

Figure 3:
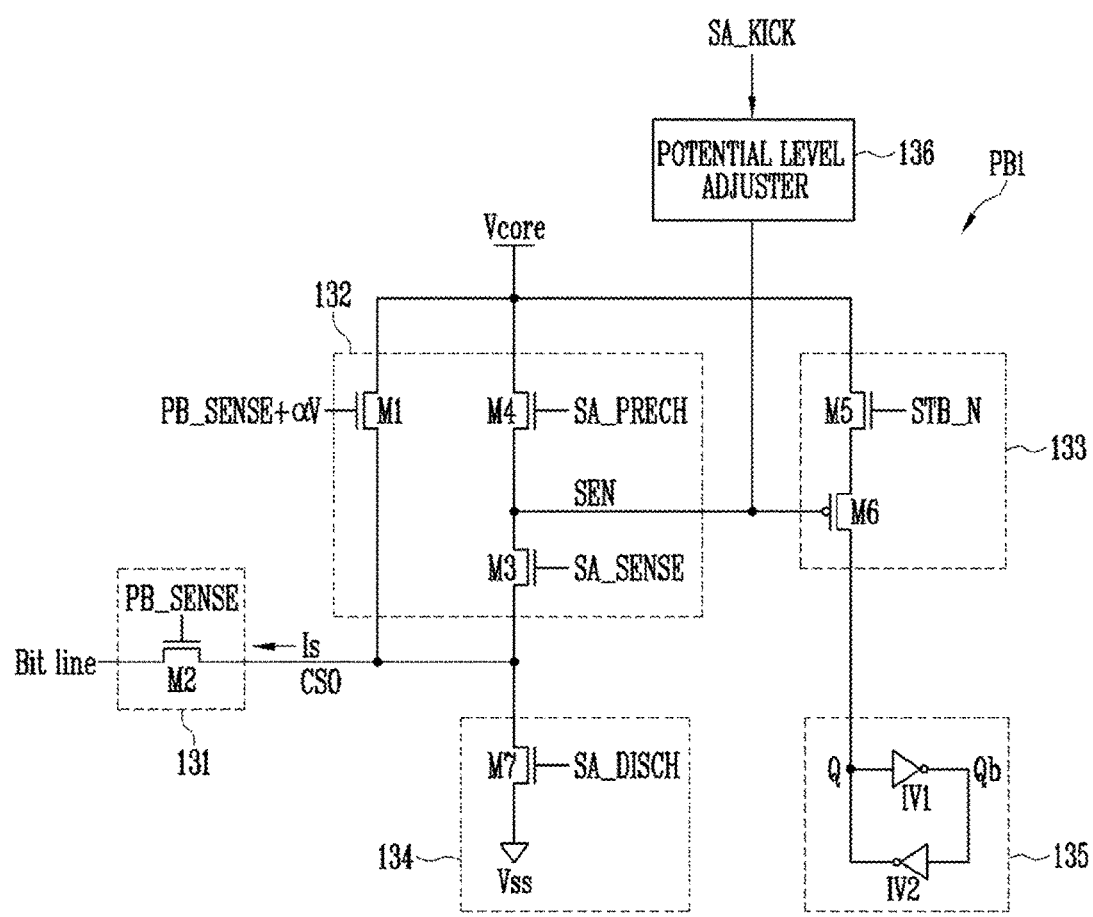
FIG. 3 is a diagram illustrating an example of a page buffer according to an embodiment of the present disclosure.

FIG. 3 is a diagram illustrating an example of a page buffer according to an embodiment of the present disclosure.

Referring to FIG. 3, the page buffer PB1 may include a bit line sensing circuit 131, a clamp circuit 132, a current determining circuit 133, an internal node discharge circuit 134, a latch circuit 135, and a potential level adjuster 136.

The bit line sensing circuit 131 may be coupled between a bit line Bit line and an internal node CS0. The bit line sensing circuit 131 may electrically couple the bit line Bit line and the internal node CS0 to each other in response to a page buffer sensing signal PB_SENSE, thereby controlling a potential of the internal node CS0 according to a potential of the bit line Bit line. Referring to FIG. 3, the bit line sensing circuit 131 may include a transistor M2. The page buffer sensing signal PB_SENSE may be applied to a gate electrode of the transistor M2.

The clamp circuit 132 may be coupled between a power supply Vcore and the internal node CS0. The clamp circuit 132 may allow current to flow to the internal node CS0 in response to a setting voltage PB_SENSE+αV, which is higher by a predetermined potential (αV) than the page buffer sensing signal PB_SENSE applied to the bit line sensing circuit 131, a precharge signal SA_PRECH, and a sensing signal SA_SENSE.

The clamp circuit 132 may include a plurality of transistors M1, M3, and M4. The transistor M1 may be coupled between the power supply Vcore and the internal node CS0. The transistor M1 may be turned on/off in response to the setting voltage PB_SENSE+αV. The transistors M4 and M3 may be coupled in series between the power supply Vcore and the internal node CS0. The transistor M4 may be turned on/off in response to the precharge signal SA_PRECH, and the transistor M3 may be turned on/off in response to the sensing signal SA_SENSE.

The current determining circuit 133 may be coupled between the power supply Vcore and the latch circuit 135. The current determining circuit 133 may allow current to flow to the latch circuit 135 in response to a strobe signal STB_N. Here, the amount of current flowing to the latch circuit 135 may be determined depending on a potential of a sensing node SEN coupled between the transistors M3 and M4 of the clamp circuit 132.

The current determining circuit 133 may include transistors M5 and M6 coupled in series between the power supply Vcore and the latch circuit 135. The transistor M5 may be turned on/off in response to the strobe signal STB_N. The transistor M6 may adjust the amount of current flowing from the power supply Vcore according to the potential of the sensing node SEN, and may allow the current to flow to the latch circuit 135.

The internal node discharge circuit 134 may be coupled between the internal node CS0 and a ground power source Vss, and may discharge the internal node CS0 to a low level in response to a discharge signal SA_DISCH. The internal node discharge circuit 134 may include a transistor M7 coupled between the internal node CS0 and the ground power source Vss. The transistor M7 is turned on/off in response to the discharge signal SA_DISCH.

The latch circuit 135 may be coupled to the current determining circuit 133, and may store data according the amount of current flowing from the current determining circuit 133. The latch circuit 135 may cross-coupled logic gates. For example, the latch circuit 135 may include cross-coupled inverters IV1 and IV2, which are coupled between first and second nodes Q and Qb.

The potential level adjuster 136 may be coupled to the sensing node SEN, and may adjust a precharge potential level of the sensing node SEN in response to a kick signal SA_KICK. For example, when the potential level of the kick signal SA_KICK is high, the precharge potential level of the sensing node SEN may increase. When the potential level of the kick signal SA_KICK is low, the precharge potential level of the sensing node SEN may decrease.

Although not illustrated in FIG. 3, the potential level adjuster 136 may include a capacitor coupled to the sensing node SEN. The capacitor may have first and second electrodes (not illustrated), and a first electrode of the capacitor may be coupled to the sensing node SEN, and the kick signal SA_KICK may be applied through the second electrode of the capacitor. When the potential level of the kick signal SA_KICK is high, the precharge potential level of the sensing node SEN may increase. When the potential level of the kick signal SA_KICK is low, the precharge potential level of the sensing node SEN may decrease.

Figure 4:
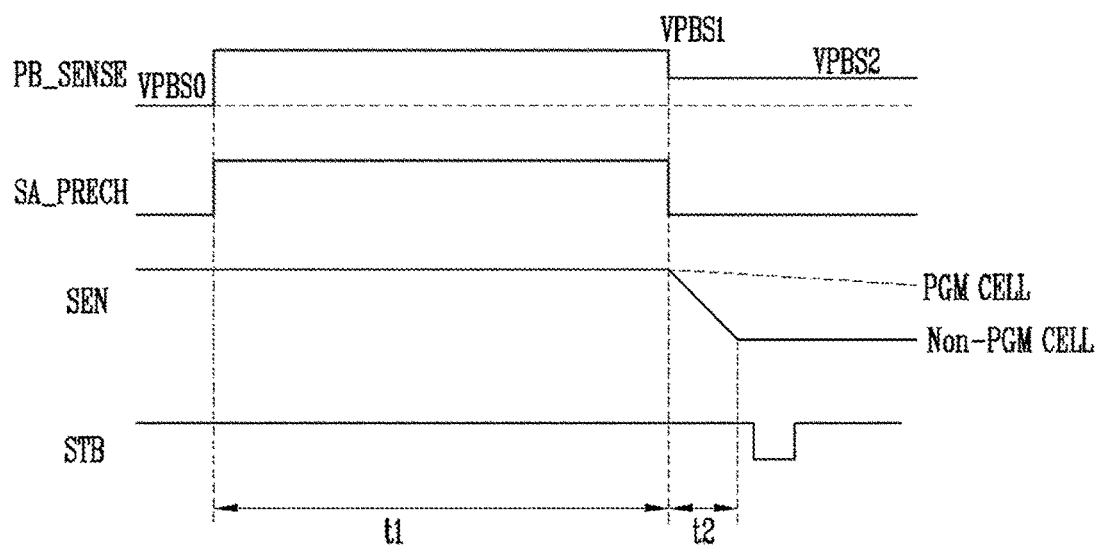
FIG. 4 is a timing diagram illustrating an example of an operation of a page buffer according to an embodiment of the present disclosure.

FIG. 4 is a timing diagram illustrating an example of an operation of a page buffer according to an embodiment of the present disclosure.

More specifically, FIG. 4 is a timing diagram of signals input to the page buffer of the semiconductor memory device in a read operation of the memory cell array.

In FIG. 4, a page buffer sensing signal PB_SENSE and a precharge signal SA_PRECH may be transitioned from a low value to a high value at the beginning of a period of time t1. More specifically, the page buffer sensing signal PB_SENSE may be transitioned from an initial voltage VPBS0 to a first page buffer sensing voltage VPBS1. Here, the initial voltage VPBS0 may be a ground voltage. That is, the initial voltage VPBS0 is a voltage at which the transistor M2 is turned off.

As the page buffer sensing signal PB_SENSE and precharge signal SA_PRECH are at the high value, the voltage level of the sensing node SEN is at a high level. Meanwhile, a voltage level of a strobe signal STB may maintain a high level during the period of time t1.

At a point in time when the period of time t1 ends and a period of time t2 starts, the precharge signal SA_PRECH may be transitioned from the high level to the low level. At a point in time when the precharge signal SA_PRECH is transitioned from the high value to the low value, the voltage of the page buffer sensing signal PB_SENSE may be changed. More specifically, the page buffer sensing signal PB_SENSE may be changed from the first page buffer sensing voltage VPBS1 to a second page buffer sensing voltage VPBS2. As the voltage level of the page buffer sensing signal PB_SENSE is changed from the first page buffer sensing voltage VPBS1 to the second page buffer sensing voltage VPBS2, a gate-source voltage Vgs of the transistor M2 illustrated in FIG. 3 may decrease. Accordingly, a sensing current Is flowing through the transistor M2 decreases. Here, the second page buffer sensing voltage VPBS2 is a voltage that is lower than the first page buffer sensing voltage VPBS1 but higher than a threshold voltage of the transistor M2. Thus, although the voltage level of the page buffer sensing signal PB_SENSE is changed to the second page buffer sensing voltage VPBS2, current still flows between source and drain electrodes of the transistor M2. However, as the voltage of the page buffer sensing signal PB_SENSE is changed from the first page buffer sensing voltage VPBS1 to the second page buffer sensing voltage VPBS2, the amount of current flowing between the source and drain electrodes of the transistor M2 is also changed. Specifically, as the voltage level of the page buffer sensing signal PB_SENSE is decreased to the second page buffer sensing voltage VPBS2, the amount of current flowing between the source and drain of the transistor M2 also decreases.

In an embodiment of the present disclosure, the sensing current Is may decrease by applying the second page buffer sensing voltage VPBS2, which is lower than the first page buffer sensing voltage VPBS1, during a sensing time, and as a result the time it takes to drop or raise the voltage of the sensing node SEN may decrease. Accordingly, the sensing margin of the transistor M6 may be improved, and the sensing reliability of the page buffer PB1 may be improved.

During the period of time t2, the voltage of the sensing node SEN may be determined depending on a program state of a memory cell coupled to a bit line. As illustrated in FIG. 4, when the memory cell coupled to the bit line is an erased cell Non-PGM CELL, the voltage of the sensing node SEN rapidly decreases. When the memory cell coupled to the bit line is a programmed cell PGM CELL, however, the time it takes for the voltage of the sensing node SEN to decrease may be longer than when the memory cell is the erased cell Non-PGM CELL. In other words, when the memory cell coupled to the bit line is a programmed cell PGM CELL, a discharge time of the sensing node SEN may be longer than when the memory cell is the erased cell Non-PGM CELL.

How the discharge time of the sensing node SEN can improve a sensing margin will be described later with reference to FIGS. 6 and 7.

Figure 5:
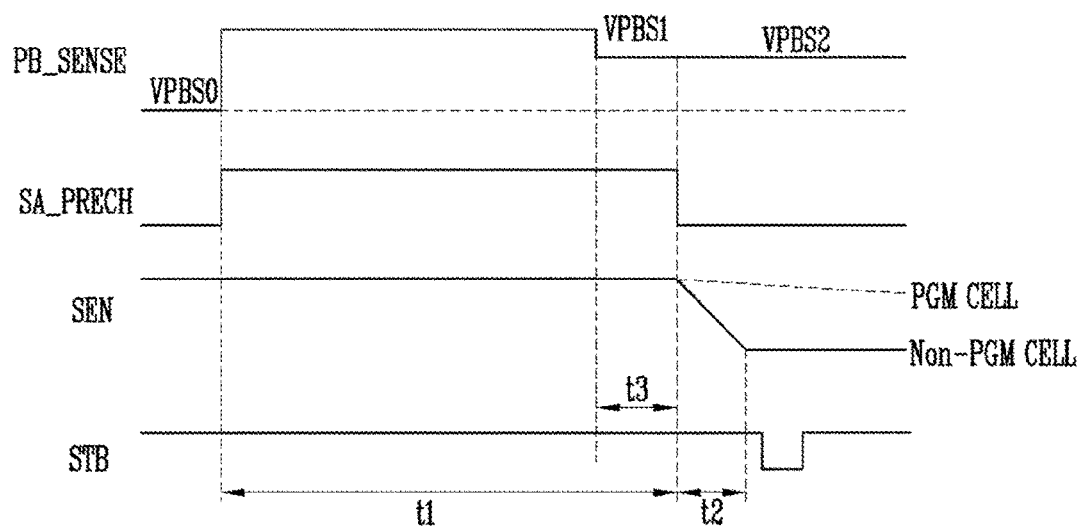
FIG. 5 is a timing diagram illustrating an example of an operation of the page buffer according to an embodiment of the present disclosure.

FIG. 5 is a timing diagram illustrating an example of an operation of the page buffer according to an embodiment of the present disclosure.

The timing diagram of FIG. 5 is different from that of FIG. 4 in that before the period of time t1 ends (e.g., before the precharge signal SA_PRECH is transitioned to the low value), the voltage of the page buffer sensing signal PB_SENSE may be changed from the first page buffer sensing voltage VPBS1 to the second page buffer sensing voltage VPBS2. For example, when a period of time t3 starts, the voltage of the page buffer sensing signal PB_SENSE may be changed from the first page buffer sensing voltage VPBS1 to the second page buffer sensing voltage VPBS2. As a result, the gate-source voltage Vgs of the transistor M2 may decrease before the precharge signal SA_PRECH is transitioned to the low value. Thus, the gate-source voltage Vgs of the transistor M2 decreases, so that the sensing current Is flowing between the internal node CS0 and the bit line Bit line decreases. Accordingly, the sensing margin of the transistor M6 may be improved, and the sensing reliability of the page buffer PB1 may be improved.

Figure 6:
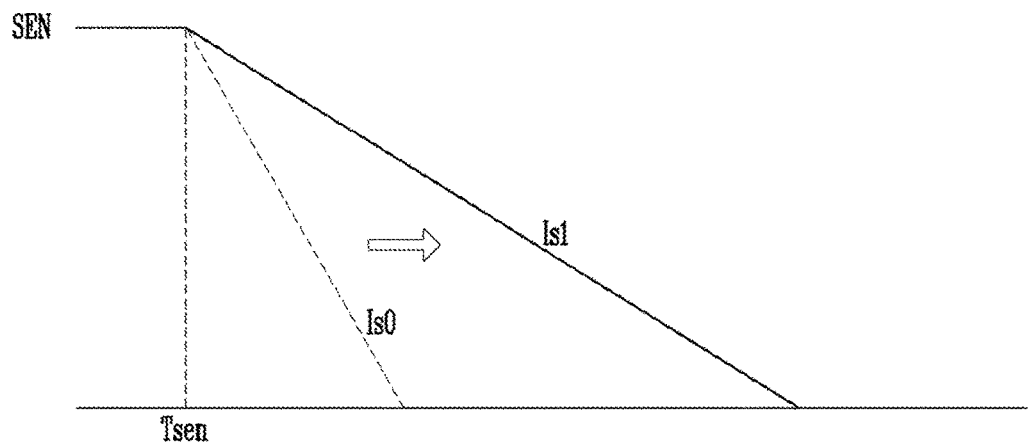
FIG. 6 is a timing diagram illustrating an example of an operation of the page buffer according to an embodiment of the present disclosure.

FIG. 6 illustrates a discharge time of the sensing node SEN when the voltage of the page buffer sensing signal PB_SENSE decreases according to an embodiment of the present disclosure.

Referring to FIG. 6, the discharge time of the sensing node SEN may vary depending on the page buffer sensing signal PB_SENSE. For example, when the memory cell coupled to the bit line is the erased cell Non-PGM CELL, the discharge time of the sensing node SEN may vary depending on the page buffer sensing signal PB_SENSE. Specifically, referring to FIG. 4, a sensing current flowing when the voltage of the page buffer sensing signal PB_SENSE is at the first page buffer sensing voltage VPBS1 during the sensing time may be referred to as a first sensing current Is0, and a sensing current flowing when the voltage of the page buffer sensing signal PB_SENSE is at the second page buffer sensing voltage VPBS2 during the sensing time may be referred to as a second sensing current Is1.

When the first page buffer sensing voltage VPBS1 is greater than the second page buffer sensing voltage VPBS2, the first sensing current Is0 may be greater than the second sensing current Is1. In FIG. 6, a dotted line may indicate a change in the voltage of the sensing node SEN over the change in the second sensing current Is1 (i.e., the sensing current Is flowing through the transistor M2 when the page buffer sensing signal PB_SENSE is at the second page buffer sensing voltage VPBS2), and a solid line indicates a change in the voltage of the sensing node SEN over the change in the first sensing current Is0 (i.e., the sensing current Is flowing through the transistor M2 when the page buffer sensing signal PB_SENSE is at the first page buffer sensing voltage VPBS1). When the sensing current Is flowing through the transistor M2 is the first sensing current Is0, the change in the voltage of the sensing node SEN is relatively fast, and when the sensing current Is flowing through the transistor M2 is the second sensing current Is1, the change in the voltage of the sensing node SEN is relatively slow. After a sensing time Tsen, when the sensing current Is is the first sensing current Is0, the voltage of the sensing node SEN rapidly decreases, and when the sensing current Is is the second sensing current Is1, the voltage of the sensing node SEN slowly decreases. The change in the voltage of the sensing node SEN is indicated by a solid line in FIG. 6.

Figure 7:
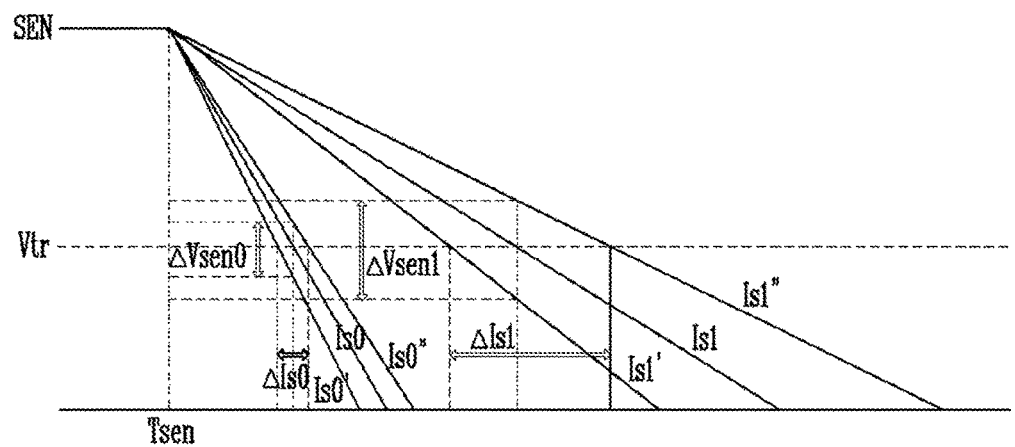
FIG. 7 is a timing diagram illustrating an example of an operation of the page buffer according to an embodiment of the present disclosure.

FIG. 7 illustrates a change in the sensing margin according to the sensing current Is.

FIG. 7 illustrates a case where the value of the sensing current Is is slightly changed from the first sensing current Is0 and a case where the value of the sensing current Is is slightly changed from the second sensing current Is1. Specifically, in FIG. 7, three solid lines Is0', Is0, and Is0" indicate a change in the voltage of the sensing node SEN over the change in the second sensing current Is0 (i.e., the sensing current Is flowing through the transistor M2 when the page buffer sensing signal PB_SENSE is at the first page buffer sensing voltage VPBS1), and three solid lines Is1', Is1, and Is1" indicate a change in the voltage of the sensing node SEN over the change in the second sensing current Is1 (i.e., the sensing current Is flowing through the transistor M2 when the page buffer sensing signal PB_SENSE is at the second page buffer sensing voltage VPBS2).

In FIG. 7, when the voltage of the page buffer sensing signal PB_SENSE is at the first page buffer sensing voltage VPBS1 during the sensing time, based on a voltage Vtr, the variation of the sensing current Is may be referred to as ΔIs0, and the variation of a sensing voltage may be referred to as ΔVsen0. Likewise, when the voltage of the page buffer sensing signal PB_SENSE is decreased to the second page buffer sensing voltage VPBS2 during the sensing time, based on the voltage Vtr, the variation of the sensing current Is may be referred to as ΔIs1, and the variation of the sensing voltage may be referred to as Δvsen1. Here, Δvsen1 is greater than ΔVsen0, and ΔIs1 is greater than ΔIs0. That is, when the voltage of the page buffer sensing signal PB_SENSE is decreased to the second page buffer sensing voltage VPBS2 during the sensing time, the sensing margin is increased, and accordingly, the sensing reliability of the page buffer PB1 can be improved.

FIG. 8 is a flowchart illustrating an example of an operating method of the semiconductor memory device according to an embodiment of the present disclosure. Referring to FIG. 8, the operating method according to an embodiment of the present disclosure may include a step of inputting a read command (S110), a step of precharging an internal node of a page buffer (S130), a step of sensing data of a bit line coupled to the page buffer (S150), and a step of outputting the sensed data (S170).

In the step of inputting a read command (S110), if a read command is input (e.g. from an external device), a command CMD and a control signal CTRL may be input to the control logic 140 in response to the read command. The control logic 140 may output signals for controlling the address decoder 120, the read/write circuit 130, and the voltage generator 150 so as to perform a read operation according to the command CMD and the control signal CTRL.

In the step of precharging an internal node of a page buffer (S130), each of the plurality of page buffer PB1 to PBm may precharge the internal node CS0 to a predetermined potential level. The sensing signal SA_SENSE and the precharge signal SA_PRECH may be at a high level such that the transistors M4 and M5 are turned on. Therefore, the internal node CS0 may be precharged to the level of the power supply voltage Vcore.

In the step of sensing data of a bit line coupled to the page buffer (S150), the read voltage Vread generated by the voltage generator 140 may be applied to a selected word line of a selected memory block among the plurality of memory blocks BLK1 to BLKz. The pass voltage Vpass may be applied to unselected word lines.

Each of the plurality of page buffers PB1 to PBm may perform a data sensing operation. The data sensing operation may be performed as follows.

The page buffer sensing signal PB_SENSE may be applied at a high level such that the bit line Bit line and the internal node CS0 are electrically coupled to each other.

The precharge signal SA_PRECH may be transitioned from the high level to a low level after a predetermined time, thereby blocking the power supply voltage Vcore applied to the internal node CS0. When the threshold voltage of a memory cell coupled to the selected word line is lower than the read voltage Vread, the memory cell is turned on, and as a result the internal node CS0 may be discharged to the low level due to a discharge current path through the bit line Bit line.

Therefore, the internal node CS0 and the sensing node SEN may be discharged to the low level, and thus the transistor M6 may be turned on.

If the transistor M5 is turned on as the strobe signal STB_N is at the low level during a predetermined time, the power supply voltage Vcore is applied to the first node Q of the latch circuit 135 such that a voltage level of the first node Q becomes the high level. Therefore, data corresponding to an erased cell may be latched at the latch circuit 135.

When the threshold voltage of the memory cell coupled to the selected word line is higher than the read voltage Vread, the memory cell is turned off such that the potential of the internal node CS0 stays at a precharge level.

Therefore, the internal node CS0 and the sensing node SEN maintain the precharge level. After that, the strobe signal STB_N may be at the low level during a predetermined time such that, although the transistor M5 is turned on, the transistor M6 is turned off by the sensing node SEN having the precharge level. Thus, as the first node Q of the latch circuit 135 maintains the low level that is an initial state, data corresponding to a programmed cell may be latched at the latch circuit 135.

In the step of outputting the sensed data (S170), each of the plurality of page buffers PB1 to PBm may output data DATA sensed in the sensing operation.

FIG. 9 is a timing diagram illustrating in detail an example of the step of sensing the data in FIG. 8.

Referring to FIG. 9, the step of sensing data (S150) of FIG. 8 may include a step of changing a voltage of the page buffer sensing signal PB_SENSE (S210), a step of changing a voltage of the precharge signal SA_PRECH (S230), and a step of applying the strobe signal STB (S250). That is, in FIG. 9, the page buffer sensing signal PB_SENSE and the precharge signal SA_PRECH are changed as illustrated in the timing diagrams of FIGS. 4 to 7.

In the step of changing the voltage of the page buffer sensing signal PB_SENSE (S210), the voltage of the page buffer sensing signal PB_SENSE may be changed from the first page buffer sensing voltage VPBS1 to the second page buffer sensing voltage VPBS2. Specifically, in an embodiment of the present disclosure, the second page buffer sensing voltage VPBS2 may be smaller than the first page buffer sensing voltage VPBS1. Accordingly, the sensing margin with respect to the voltage of the sensing node SEN may be improved.

In the step of changing the voltage of the precharge signal SA_PRECH (S230), the voltage of the precharge signal SA_PRECH may be transitioned from the high level to the low level.

In the step of applying the strobe signals STB (S250), the strobe signal STB may be transitioned from a high-level voltage to a low-level voltage during a predetermined time. Accordingly, the voltage of the sensing node SEN may be latched at the latch circuit 135.

Figure 10:
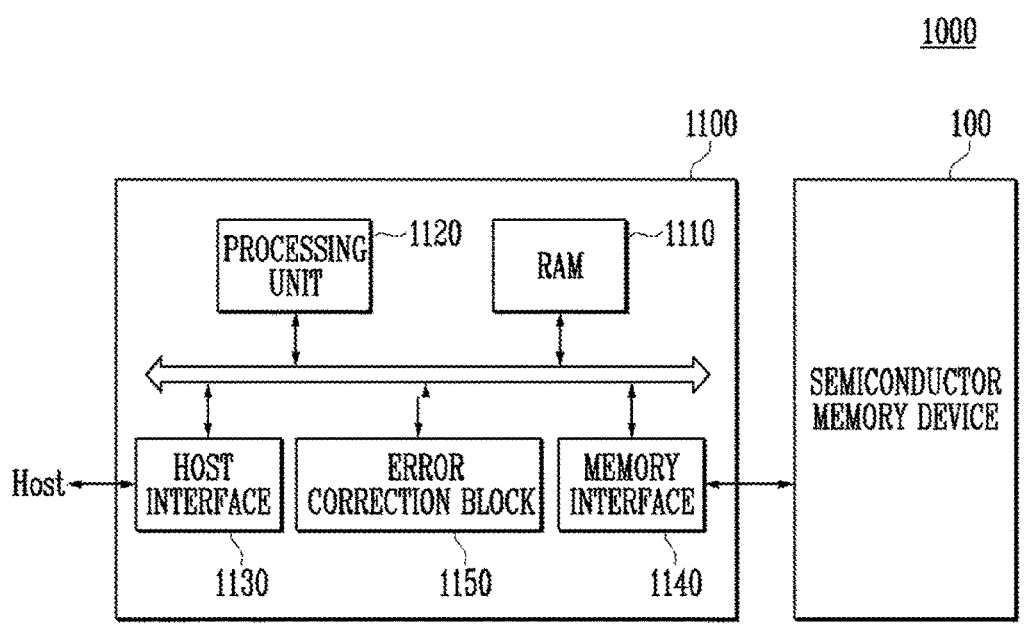
FIG. 10 is a diagram illustrating an example of a memory system including the semiconductor memory device of FIG. 1.

FIG. 10 is a diagram illustrating an example of a memory system including the semiconductor memory device of FIG. 1.

Referring to FIG. 10, the memory system 1000 includes a semiconductor memory device 100 and a controller 1100.

The semiconductor memory device 100 may be similar or identical to the semiconductor memory device described with reference to FIG. 1, and thus any repetitive detailed description will be omitted or simplified.

The controller 1100 may be coupled to a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the semiconductor memory device 100 and the host Host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host Host, and a buffer memory between the semiconductor memory device 100 and the host Host. The processing unit 1120 may control the general operations of the controller 1100. Also, the controller 1100 may temporarily store program data provided from the host Host in a write operation.

The host interface 1130 may include a protocol for exchanging data between the host Host and the controller 1100. In an example embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface 1140 may include a NAND interface or a NOR interface.

The error correction block 1150 may detect and correct an error of data received from the semiconductor memory device 100 by using an error correction code (ECC). As an exemplary embodiment, the error correction block 1150 may be provided as a component of the controller 1100.

The controller 1100 and the semiconductor memory device 100 may be integrated into one semiconductor device. In an example embodiment, the controller 1100 and the semiconductor memory device 100 may be integrated into a memory card. For example, the controller 1100 and the semiconductor memory device 100 may be integrated into a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into a semiconductor drive (e.g., solid state drive (SSD)). The semiconductor drive (e.g., SSD) may include a storage device that stores data in a semiconductor memory.

In an example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an example embodiment, the semiconductor memory device 100 or the memory system 1000 may be packaged in various forms. Examples of the forms of packages may include package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 11:
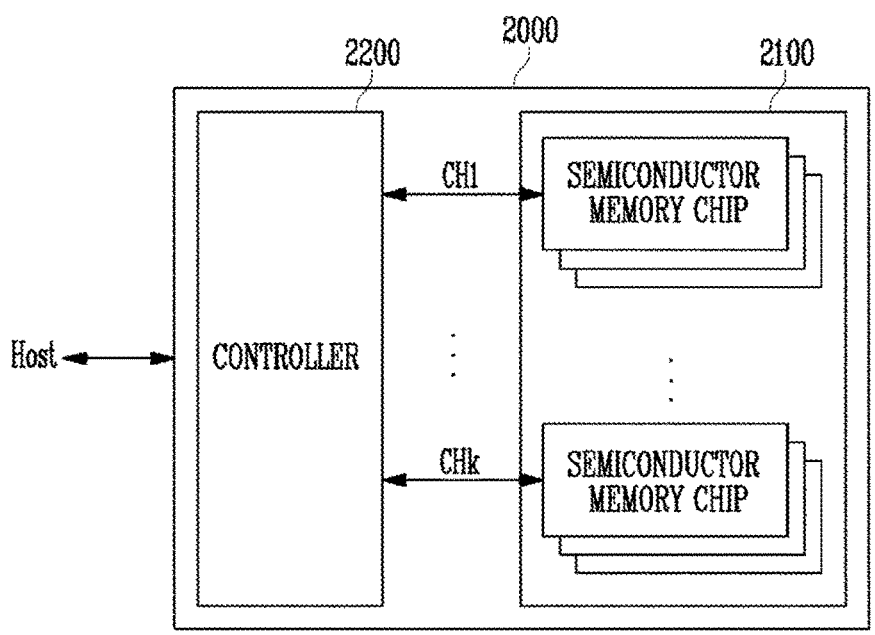
FIG. 11 is a diagram illustrating an application example of the memory system of FIG. 10.

FIG. 11 is a diagram illustrating an example of an application example of the memory system of FIG. 10.

Referring to FIG. 11, the memory system 2000 includes a semiconductor memory device 2100 and a controller 2200. The semiconductor memory device 2100 may include a plurality of semiconductor memory chips. The plurality of semiconductor memory chips are divided into a plurality of groups.

In FIG. 8, it is illustrated that the plurality of groups communicates with the controller 2200 through first to k$^{th}$ channels CH1 to CHk. Configurations and operations of each semiconductor memory chip may be similar or identical to those of the semiconductor memory device 100 described with reference to FIG. 1.

Each group may communicate with the controller 2200 through a common channel. The controller 2200 is configured similarly to the controller 1100 described with reference to FIG. 10. The controller 2200 may control the plurality of memory chips of the semiconductor memory device 2100 through the plurality of channels CH1 to CHk.

Figure 12:
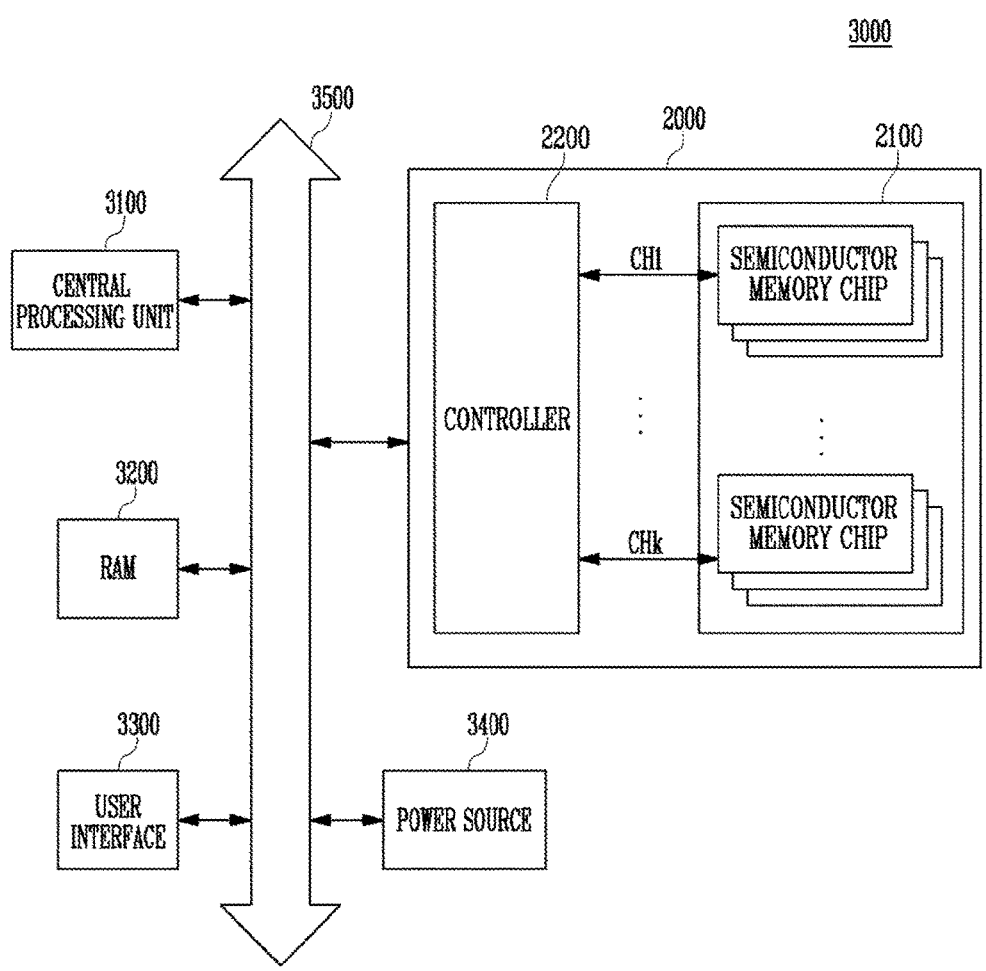
FIG. 12 is a diagram illustrating an example of a computing system including the memory system described with reference to FIG. 11.

FIG. 12 is a diagram illustrating an example of a computing system including the memory system described with reference to FIG. 11.

Referring to FIG. 12, the computing system 3000 may include a central processing unit 3100, a RAM 3200, a user interface 3300, a power source 3400, a system bus 3500, and a memory system 2000.

The memory system 2000 may be electrically coupled to the central processing unit 3100, the RAM 3200, the user interface 3300, and the power source 3400 through the system bus 3500. Data transmitted through user interface 3300 or data processed by the central processing unit 3100 may be stored in the memory system 2000.

In FIG. 12, it is illustrated that the semiconductor memory device 2100 may be coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 12, it is illustrated that the memory system 2000 described with reference to FIG. 11 is provided. However, the memory system 2000 may be replaced by the memory system 1000 described with reference to FIG. 10. In an example embodiment, the computing system 3000 may include both the memory systems 1000 and 2000 described with reference to FIGS. 10 and 11.

According to an embodiment of the present disclosure, the gate-source voltage of the transistor to which the page buffer sensing signal is applied decreases, so that the current flowing between the internal node and the bit line decreases. Thus, the variation of current in the page buffer decreases, and accordingly, the sensing reliability of the page buffer is improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
a memory cell array including a plurality of memory cells;
a plurality of page buffers respectively coupled to a plurality of bit lines of the memory cell array; and
a control logic configured to control the plurality of page buffers to perform a read operation on the memory cell array,
wherein each of the plurality of page buffers performs data sensing by decreasing a voltage applied to a gate electrode of a transistor from a first page buffer sensing voltage directly to a second page buffer sensing voltage to increase a resistance on the transistor after an internal node is precharged, such that a sensing current flowing through the transistor is decreased, and
wherein the first page buffer sensing voltage and the second page buffer sensing voltage are higher than a threshold voltage of the transistor.

2. The semiconductor memory device of claim 1, wherein the control logic:
receives the first page buffer sensing voltage and the second page buffer sensing voltage;
generates the page buffer sensing signal, based on the first page buffer sensing voltage and the second page buffer sensing voltage; and
applies the generated page buffer sensing signal to the plurality of page buffers.

3. The semiconductor memory device of claim 2, wherein the page buffer sensing signal maintains the first page buffer sensing voltage during a period of time during which the internal node is precharged.

4. The semiconductor memory device of claim 3, wherein the first page buffer sensing voltage is greater than the second page buffer sensing voltage.

5. The semiconductor memory device of claim 3, wherein the page buffer sensing signal is changed to the second page buffer sensing voltage when a data sensing time is started or when a predetermined period of time has passed after the data sensing time started.

6. The semiconductor memory device of claim 1, wherein each of the plurality of page buffers includes:

a bit line sensing circuit coupled to one of the plurality of bit lines and the internal node to control a potential of the internal node according to a potential of the one of the plurality of bit lines;

a clamp circuit coupled between a power supply and the internal node to precharge the internal node;

a latch circuit configured to latch data in a sensing operation;

a current determining circuit configured to allow current corresponding to a potential of a sensing node in the clamp circuit to flow to the latch circuit; and a potential level adjuster coupled to the sensing node to adjust a precharge potential level of the sensing node.

7. The semiconductor memory device of claim 1, wherein the plurality of memory cells included in the memory cell array are memory cells having a vertical channel structure.

8. A semiconductor memory device comprising:

a memory cell array including a plurality of memory cells; and a plurality of page buffers respectively coupled to a plurality of bit lines of the memory cell array, wherein each of the plurality of page buffers performs data sensing by decreasing a voltage applied to a gate electrode of a transistor from a first page buffer sensing voltage directly to a second page buffer sensing voltage to increase a resistance on the transistor after an internal node is precharged, such that a sensing current flowing through the transistor is decreased, and wherein the first page buffer sensing voltage and the second page buffer sensing voltage are higher than a threshold voltage of the transistor.

9. The semiconductor memory device of claim 8, further comprising a control logic configured to control the plurality of page buffers to perform a read operation on the memory cell array.

10. The semiconductor memory device of claim 9, wherein the control logic applies the page buffer sensing signal to at least one of the plurality of page buffers.

11. The semiconductor memory device of claim 10, wherein the control logic:

receives the first page buffer sensing voltage and the second page buffer sensing voltage;

generates the page buffer sensing signal, based on the first page buffer sensing voltage and the second page buffer sensing voltage; and applies the generated page buffer sensing signal to the plurality of page buffers.

12. The semiconductor memory device of claim 11, wherein the first page buffer sensing voltage is greater than the second page buffer sensing voltage.

13. The semiconductor memory device of claim 12, wherein, when a precharge signal input to the page buffer is transitioned from a turn-on state to a turn-off state, the voltage of the page buffer sensing signal is changed from the first page buffer sensing voltage to the second page buffer sensing voltage.

14. The semiconductor memory device of claim 12, wherein, before the precharge signal input to the page buffer is transitioned from a turn-on state to a turn-off state, the voltage of the page buffer sensing signal is changed from the first page buffer sensing voltage to the second page buffer sensing voltage.

15. A method of operating a semiconductor memory device, the method comprising:

receiving a read command;

precharging an internal node of a page buffer in response to the read command;

decreasing a voltage applied to a gate electrode of a transistor from a first page buffer sensing voltage directly to a second page buffer sensing voltage to increase a resistance on the transistor, in order to decrease a sensing current flowing through the transistor; and sensing a voltage received through a bit line of a memory cell array, wherein the first page buffer sensing voltage and the second page buffer sensing voltage are higher than a threshold voltage of the transistor.

16. The method of claim 15, wherein the first page buffer sensing voltage is greater than the second page buffer sensing voltage.

17. The method of claim 15, wherein, when a precharge signal input to the page buffer is transitioned from a turn-on state to a turn-off state, the page buffer sensing signal is changed.

18. The method of claim 15, wherein, before the precharge signal input to the page buffer is transitioned from a turn-on state to a turn-off state, the page buffer sensing signal is changed.

19. The method of claim 15, wherein the second page buffer sensing voltage is smaller than the first page buffer sensing voltage.

\* \* \* \* \*